United States Patent [19]

Asatourian

[11] Patent Number: 5,714,760
[45] Date of Patent: *Feb. 3, 1998

[54] IMBALANCED LAYERED COMPOSITE FOCAL PLANE ARRAY STRUCTURE

[75] Inventor: Rolin K. Asatourian, Fullerton, Calif.

[73] Assignee: Boeing North American, Inc., Seal Beach, Calif.

[*] Notice: The term of this patent shall not extend beyond the expiration date of Pat. No. 5,600,140.

[21] Appl. No.: 669,076

[22] Filed: Jun. 24, 1996

Related U.S. Application Data

[63] Continuation-in-part of Ser. No. 481,000, Jun. 7, 1995, Pat. No. 5,600,140.
[51] Int. Cl.$^6$ ................................ G01J 5/16
[52] U.S. Cl. .................. 250/352; 250/332; 250/370.15
[58] Field of Search ................................ 250/332, 352, 250/370.08, 370.15

[56] References Cited

U.S. PATENT DOCUMENTS

| | | | |
|---|---|---|---|
| 5,308,980 | 5/1994 | Barton | 250/332 |
| 5,585,624 | 12/1996 | Asatourian | 250/332 |
| 5,600,140 | 2/1997 | Asatourian | 250/332 |
| 5,610,389 | 3/1997 | Asatourian | 250/332 |

*Primary Examiner*—Edward J. Glick
*Attorney, Agent, or Firm*—Charles T. Silberberg; Tom Streeter

[57] ABSTRACT

A focal plane array (FPA) including a layered composite structure having several layers of materials with differing thermal expansion coefficients (TECs) and thicknesses to stabilize and maintain FPA performance during thermal cycling and excursions. An optical substrate is coupled to a multiplexer through a network of indium bumps. The typical TEC mismatch of the layered materials is offset by particularly selecting the types of materials used and the thicknesses of the individual layers of the FPA. Consequently, undesirable deflections and distortion of the multiplexer and the indium bumps are minimized, thereby substantially improving FPA reliability.

16 Claims, 3 Drawing Sheets

IMBALANCED LAYERED COMPOSITE FOCAL PLANE ARRAY STRUCTURE

RELATED APPLICATIONS

The present application is a continuation-in-part of application Ser. No. 08/481,000 filed Jun. 7, 1995, now U.S. Pat. No. 5,600,140 issued Feb. 9, 1997.

BACKGROUND OF THE INVENTION

1. Field of the Invention

The present invention relates to stabilizing a focal plane array (FPA) on a supporting substrate. More particularly, a multi-layered stabilizing structure creates controlled stresses to counteract deflections that adversely affect the reliability of the FPA in the process of thermal cycling.

2. Description of Related Art

A hybrid FPA generally consists of an optical substrate layer, such as sapphire, coated with an optically-sensitive material. An interconnecting scheme typically formed of pliable conducting bumps, is used to establish a mechanical and electrical contact between the optical substrate and an electronic means, such as a silicon multiplexer (MUX), used for electronic signal processing. A difference between the thermal expansion coefficients (TECs) of the detector substrate and the MUX, however, can stress and eventually rupture the bumps in the process of thermal cycling.

To enhance the reliability of a hybrid FPA, a shimming, sandwiched approach has been used (FIGS. 1 and 2), in which a hybrid FPA is mounted on a multi-layer substrate. This approach has been described in related patent application Ser. No. 08/409,230, entitled "HYBRID FOCAL PLANE ARRAY STABILIZING APPARATUS AND METHOD," the disclosure of which is incorporated herein. The MUX 110, 210 is bonded onto a core layer 114, 214 having a high TEC using a bonding epoxy 112, 212. The core layer is then bonded onto a balancing layer 118, 218 of the same material and dimensions as the MUX 110, 210 using the same type of epoxy of the same thickness as the bonding epoxy 112, 212. The MUX, the core layer, the two layers of epoxy, and the balancing layer form a "balanced" structure 124, 224 that forces the MUX to exhibit a TEC which matches the TEC of the optical layer 104, 204, thereby eliminating thermally-generated stresses on the interconnect bumps 108, 208. The balanced nature of such a hybrid FPA configuration also prevents the structure from deflecting.

However, since the FPA 100, 200 is generally operated at cryogenic temperatures, reliability concerns may arise when the FPA is turned on and cooled to the operating temperature, and subsequently warmed to ambient temperature when turned off. FIGS. 1 and 2 illustrate how the difference in the TECs of the MUX 110, 210 and the optically sensitive material 106, 206 can lead to thermally induced stresses that rupture the bumps 108, 208 and degrade the performance of the optically sensitive material 106, 206. Thus, when the match between the TECs of the several materials is not precisely consistent across the entire surface of the FPA, the discontinuity at the edges of the FPA could distort the balance. As a consequence, as shown in FIG. 1, both the MUX 110 and the balancing layer 118 may be deflected toward the core layer 114 at the edges due to the edge discontinuity.

Moreover, undesirable deflection of the FPA and, consequently, the interconnect bumps, is attributable to a convex contraction of the cooling substrate, or cold plate, illustrated in FIG. 2. The cold plate 222 is typically comprised of a ceramic material or plate coupled to a vacuum dewar 220, also called a cold stem or cold well. The sides of the dewar are typically formed of a metal material, such as stainless steel, within which a vacuum 232 is formed. The central area 234 of the dewar is provided to receive a cryostat 236 containing high pressure nitrogen or argon, or other cooling substance. However, the cooling also contributes to undesirable deflection of the supporting cold plate 222. The interaction between the vacuum support structure 230 within the cold plate causes the cold plate to deflect slightly due to the mismatch in the TEC of the cold plate and that of the metal cold stem. Consequently, depending on the configuration and the material used for coupling the FPA to the cold plate 222, the balancing structure 118, 218 can be deformed relative to the cold plate.

Undesirable edge effect deflections may also be produced during contraction of the shimming epoxy 120, 220 while curing, as well as during the cooling process. The convex deflection of the MUX 210 strains the edge bumps 208 leading to bump damage. A convex deflection of the MUX may occur under other circumstances as well. Referring to FIG. 2, if the composite structure 224, including the MUX 210, the core and balancing layers 214, 218 are mounted on a support surface 222, a convex deflection of the MUX and the other layers in the composite structure could also occur due to contraction of the epoxy 220 used in mounting the composite structure onto the supporting surface 222. Because epoxies generally have a higher TEC than silicon, sapphire and the core material, some epoxies have a tendency to contract with changing temperatures. This contraction of mounting epoxy 220 may occur both during curing and cooling, depending upon the particular type of epoxy used.

SUMMARY OF THE INVENTION

An FPA structure according to an embodiment of the invention provides for elimination of undesirable deflections associated with the edge effect. A thicker balancing layer is selected to controllably force the composite structure to deflect in a concave direction by a desired amount during curing or cooling processes. Consequently, damage to the interconnecting bumps around the edges of the FPA is reduced or eliminated. Embodiments of the present invention thus incorporate an imbalanced composite structure (ICS) which provides for deflection opposite to the convex deflection of MUX at the edges, thereby to counteract the edge effect.

Embodiments of the present invention include a composite structure configuration to enhance FPA reliability. The hybrid FPA includes an optical substrate with a layer of an optically sensitive material grown on one surface of the substrate. The optically sensitive side of the substrate layer is electrically and mechanically coupled via interconnection bumps to a multiplexer substrate (MUX) used for electronic signal processing.

To enhance FPA thermal cycling reliability, the MUX is forced to contract at approximately the same rate as the optical substrate, thereby eliminating the stresses generated due to TEC mismatch between the two layers. A layer of rigid core material is mounted directly beneath the MUX. To counterbalance the bowing that would otherwise result from the TEC mismatch between the MUX and the rigid core material, a balancing layer is bonded to the opposite side of the rigid core layer. The thickness of the balancing layer thickness is different than the MUX thickness to provide an imbalanced composite structure (ICS). The thicknesses of the various layers in the ICS are determined such that the effective TEC of the composite structure matches the TEC of the optical substrate. As a result, in-plane forces, which would otherwise be present in the cooled bonded structure, are eliminated.

DETAILED DESCRIPTION OF THE PREFERRED EMBODIMENTS

The following description is of the best presently contemplated mode of carrying out the invention. In the accompanying drawings, like numerals designate like parts in the several figures. This description is made for the purpose of illustrating the general principles of the invention and should not be taken in a limiting sense. The scope of the invention is best determined by reference to the accompanying claims.

In the typical operation of a hybrid focal plane array (FPA), the FPA is cooled down to cryogenic temperatures every time it is turned on. During its lifetime, the FPA is exposed to a number of thermal cycles between ambient and cryogenic temperatures. The number of cycles depends on the particular application. In some applications, it is desirable that the FPA be able to survive thousands of thermal cycles with only minimal degradation. Thus, the FPA must maintain its mechanical integrity and electrical functionality as it is cooled down repeatedly. However, it is recognized that the larger the hybrid FPA, the greater will be the stresses caused by the mismatch of the thermal expansion coefficients (TECs) of the various layers, especially at the edges and corners of the FPA structure. Thus, the practical size of hybrid FPAs is limited by reliability problems relating to the mismatch of the material characteristics of the various layers.

According to preferred embodiments of the present invention, the symmetry of the layered materials in the hybrid FPA is perturbed in a controlled manner to counteract deleterious side-effects observed in otherwise balanced composite structures. In accordance FPA embodiments of the present invention, it has been found that sufficient stress can be created in a direction opposite that of a particular undesirable phenomenon to overcome the deleterious effects of undesirable distortion attributable to edge discontinuity and deflection.

Figure 3:
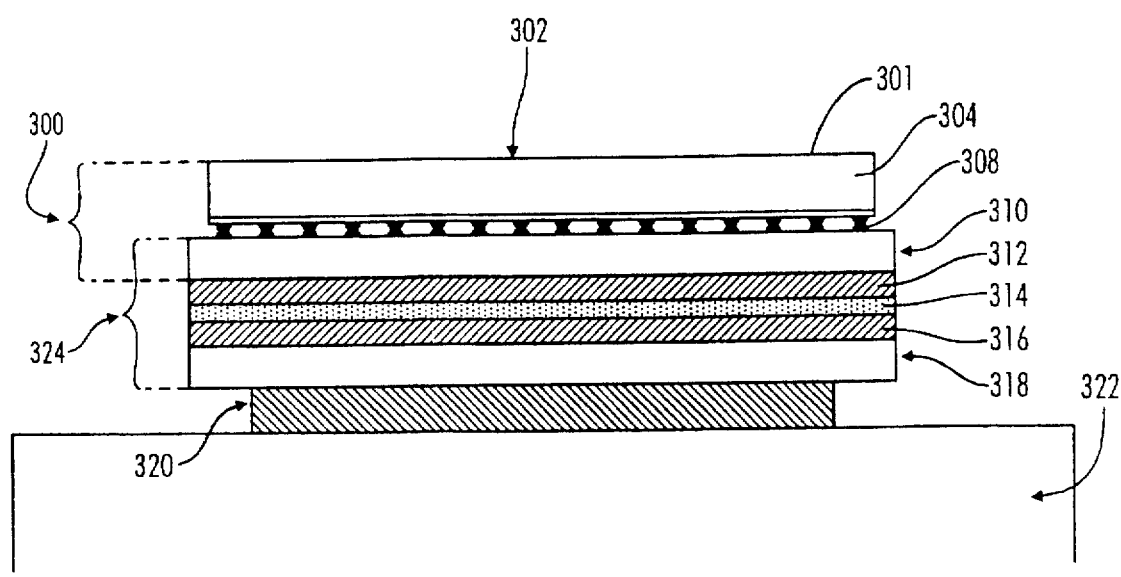
FIG. 3 is a cross sectional view of a hybrid FPA in accordance with the preferred embodiment of the present invention.

A cross-section of a hybrid focal plane array (FPA) 300 in accordance with a preferred embodiment of the present invention is indicated at 300 in FIG. 3. In the illustrated FPA, infrared radiation 302 impinges on the top surface 301 of an optical substrate 304. The optical substrate 304 is preferably formed of sapphire, with an optically sensitive material 306 grown on one of the surfaces. As shown in the FPA configuration of FIG. 3, the optically sensitive material is disposed on the lower surface of the optical substrate 304. The impinging radiation 302 is transmitted through the optical substrate 304 and arrives at the optically sensitive material 106, where it is converted to electrical charge.

Preferably, the optically sensitive material 106 comprises a mercury-cadmium-telluride (HgCdTe) compound on a buffering cadmium-telluride (CdTe).

Particular areas of the optically sensitive material 306 are electrically differentiated by isolated pixels (not shown). The electrical charge collected at each pixel location is passed through one of plural interconnect bumps 308 to corresponding cells disposed on substrate 310. The size of the FPA may vary depending upon the number of pixels in the array, e.g., 128×128 and 1024×1024.

In preferred embodiments, the substrate 310 comprises a multiplexer (MUX) containing electronic circuitry which processes the electric charge at each pixel into an electrical signal of desired characteristics, and subsequently outputs the signals via output channels. A clock is included in the MUX substrate 310 to provide for the orderly transfer of signals between the MUX substrate and the optically sensitive material 306. The MUX is preferably formed of a silicon (Si) substrate or other semiconducting material, such as gallium arsenide (GaAs), appropriate for fabricating integrated circuits. It will be recognized, however, that the materials and configuration of the MUX substrate, the number of output channels, the signal characteristics, the clocking scheme and its speed will vary depending upon the particular application. Alternately, the substrate 310 may comprise a basic interconnection scheme which allows for output electric charge from each pixel without electronic processing.

For improved performance, the FPA 300 generally must be cooled to cryogenic temperatures. The support surface 322 is preferably cooled by a direct contact cold source, such as a cryostat or liquid cryogen. In preferred embodiments, the support surface 322 is formed of a ceramic material, and the mounting epoxy 320 is Sylgard. The epoxy 320 is preferably constructed having a height and area to satisfy the thermal conductivity requirements of a particular application. For example, a thinner support surface and epoxy structure having a large surface area and high thermal conductivity provides an FPA having a fast cooling rate.

The MUX substrate 310 and the optical substrate 304 differ in their Thermal Expansion Coefficients (TECs). For example, preferably, the MUX substrate 310 is formed of sapphire, and the optical substrate is a silicon structure. Due to the differences in the properties of the materials used, including the mismatch of their TECs, thermal stresses are created in the cooling process. As a consequence, in-plane forces, which strain the bumps laterally, as well as out-of-plane forces, which strain and compress the interconnect bumps vertically, may be generated. Moreover, since the bumps on one side to the surface of the optically sensitive material, the in-plane and out-of-plane forces are also transmitted to the optically sensitive material, thus degrading the quality of the material and causing a potentially significant decline in the performance of the FPA. Repeated cool-down of the FPA may aggravate the damage.

To improve FPA reliability, the MUX 310 is preferably mounted on a core layer 314 using an appropriate epoxy 312. The core layer is preferably formed of a rigid material, such as stainless steel, which has a higher modulus of elasticity and TEC than the MUX. The core layer 314 is coupled to a balancing layer 318 using another layer of epoxy 316 which is selected to have the same or similar type and thickness as epoxy layer 312. Accordingly, since the epoxy layers 312 and 318 have similar characteristics, and the balancing layer 318 is preferably formed of the same or similar material and thickness as the MUX 310, a symmetry exists where the core layer 314 represents the plane of symmetry within the composite structure.

In preferred embodiments, the composite structure 324 is constructed of imbalanced layers of materials to induce a predetermined amount of stress which can counteract deleterious edge effects. Whether balanced or imbalanced, the composite structure 324 exhibits a TEC that is the same as or similar to that of the detector substrate 304, thereby eliminating stresses caused by a substantial TEC mismatch between the optical substrate 304 and MUX 310. Such a structure, if not perturbed by external forces such as contraction of the mounting epoxy 320, would consequently resist bowing or deflecting.

Figure 1:
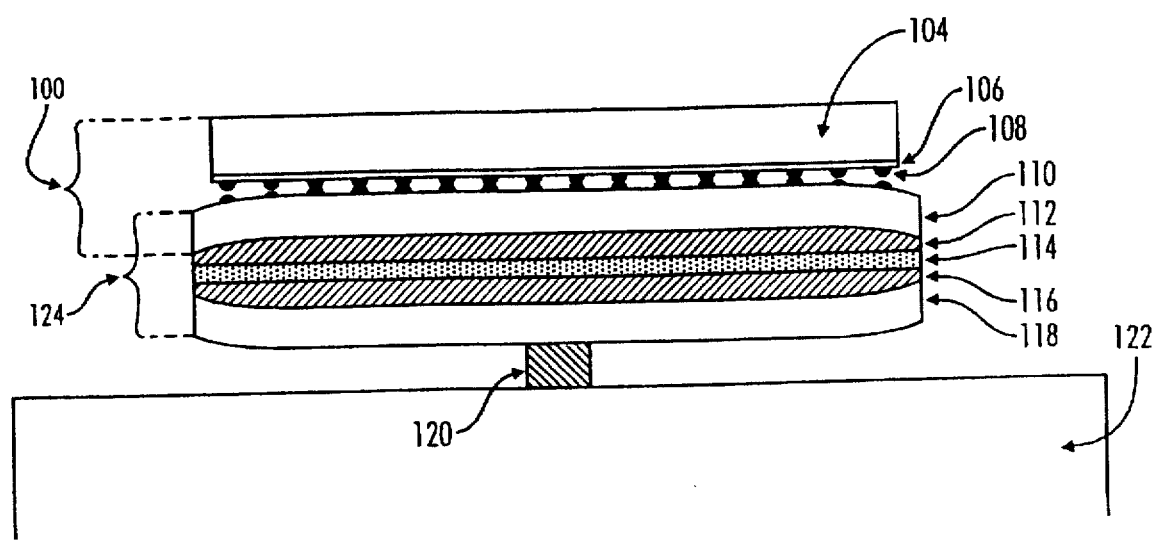
FIG. 1 is a cross-sectional view of a hybrid FPA affected by bump damage due to edge effects.
Figure 2:
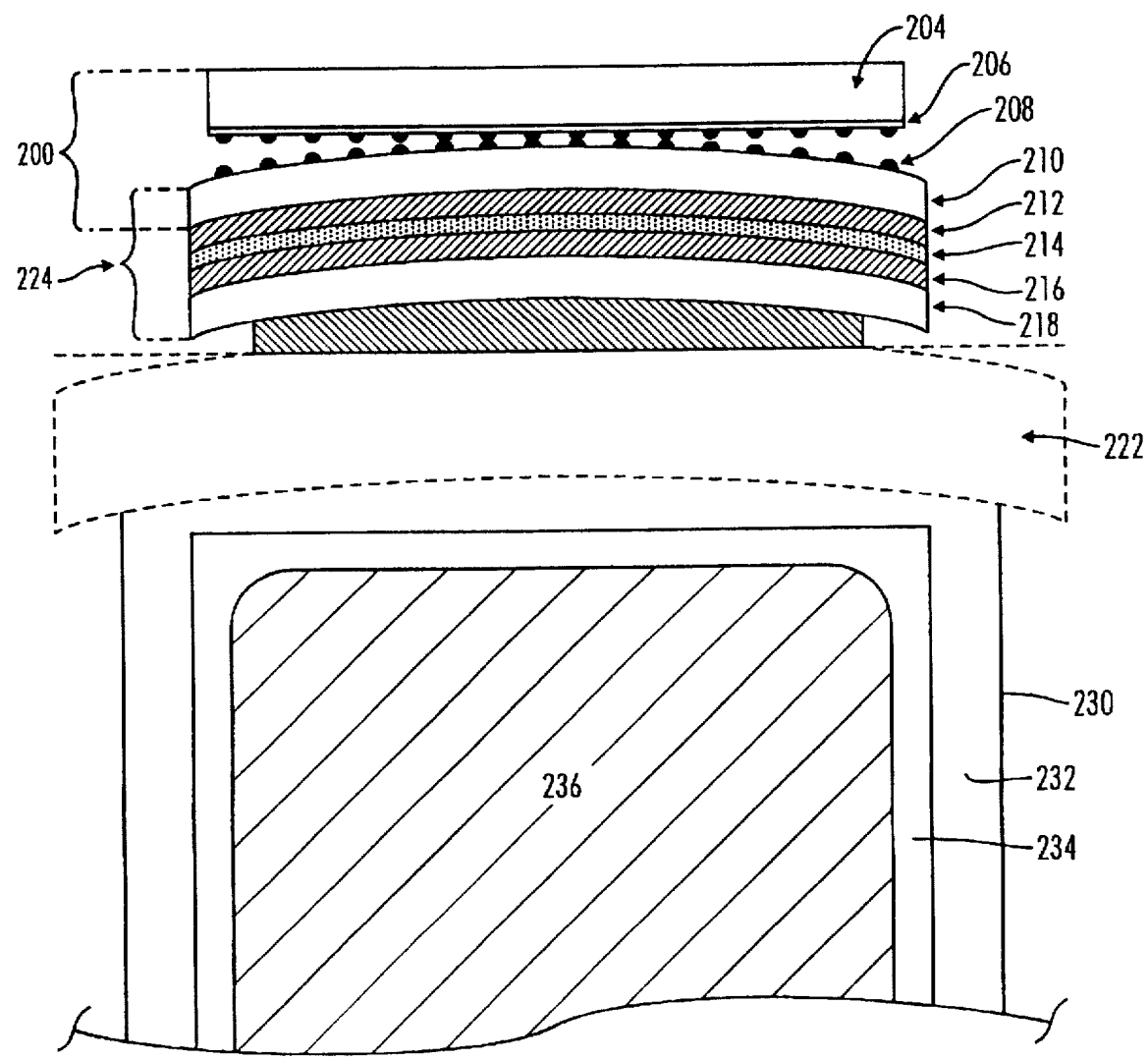
FIG. 2 is a cross-sectional view of a hybrid FPA affected by bump damage attributable to contraction of the mounting epoxy.

FIG. 3 illustrates the FPA and composite structure mounted on a support substrate 322 for physical support and cooling. For desired rates of cooling, the mounting epoxy 320 may be constructed to be large relative to the area of the MUX 310. That is, a large deposit of epoxy between the composite structure 324 and the support substrate 322 provides faster heat conduction between the two sets of materials. However, as explained above, such epoxies tend to contribute to the distortion of the MUX substrate 310, consequently, causing damage to the interconnect bumps 308 coupling the optically sensitive material 306 to the MUX, as indicated in FIGS. 1 and 2.

Thus, to counteract the detrimental effects of the contracting epoxy, as well as other causes of bowing and deflection of the MUX 110, embodiments of the present invention propose implementing a MUX substrate and a balancing layer 318 within the composite structure 324 which have differing thicknesses and characteristics. Accordingly, an imbalanced composite structure is presented. As illustrated in FIG. 3, the balancing layer 318 is slightly thicker than the MUX substrate 310 to counteract the tendency of the MUX edges to distort. By preserving the surface planarity of the MUX 310, the integrity of the interconnect bumps 308 can be maintained. Such counterbalancing the out-of-plane forces acting on the MUX also enhances, or at least maintains, the performance of the hybrid FPA structure.

Furthermore, in instances where the composite structure 324 is distorted into a concave configuration by external forces which may be present when the FPA is exposed to a bump reflow process, for example, an imbalanced structure also provides a stabilizing platform. In such circumstances, it may be desirable to construct the composite structure so that the balancing layer 318 is thinner than the MUX 310.

Alternatively, an imbalanced structure may also be provided using particular materials having differing characteristics or material properties. For example, a balancing layer having a low TEC and/or a high modulus of elasticity may be used to counterbalance opposing characteristics of the material used to construct the MUX substrate. The result would be similar to using a thicker balancing layer when the materials of the balancing layer and the MUX are the same or similar. In another alternative, the thicknesses and the material characteristics of both the balancing layer and the MUX may be tailored to produce the desired counteracting effect. Furthermore, by varying the thickness and type of epoxy 316 used to couple the MUX and the balancing layer, as well as that of the support epoxy 320, a desired imbalance may be provided.

It will be recognized that a variety of adhesives and epoxies may be used to bond the various layers of the FPA, including the composite structure, together. For example, adhesives or other coupling means may be implemented to satisfy the TEC, modulus of elasticity, thermal conductance, out-gassing, curing, and other mechanical, thermal, chemical, manufacturing, and economic requirements desired in a particular design.

This detailed description is set forth only for purposes of illustrating examples of the present invention and should not be considered to limit the scope thereof in any way. Clearly numerous additions, substitutions, and other modifications can be made to the invention without departing from the scope of the invention which is defined in the appended claims and equivalents thereof.

What is claimed is:

1. A hybrid Focal Plane Array (FPA) structure coupled to a cooling cold plate such that cooling of the FPA structure via the cold plate exposes the FPA structure to thermal excursions which contribute to undesirable distortion, the FPA structure having properties for reducing the undesirable distortion, the FPA structure comprising:

a detector including an optical substrate for receiving incoming radiation and for converting the incoming radiation to electrical charge;

a composite structure (CS) coupled between the detector and the cold plate, the CS including
electronic means for receiving the electrical charge from the optical substrate, the electronic means being subject to distortion from the thermal excursions, and
a balancing substrate coupled to the electronic means for balancing the distortion experienced by the electronic means; and interconnection means for mechanical, electrical, and thermal coupling of the detector to the CS, such that the radiation detected by the detector is transmitted as electrical charge through the interconnection means to the electronic means, wherein the distortion of the electronic means caused by thermal excursions tend to damage the interconnection means, further wherein the electronic means and the balancing substrate have differing thicknesses and thermal expansion coefficients (TECs) such that distortion of the composite structure is minimized, thereby reducing damage to the interconnection means.

2. The hybrid FPA of claim 1, wherein the optical substrate comprises a crystalline material.

3. The hybrid FPA of claim 2, wherein the detector comprises a combination of mercury-cadmium-telluride and cadmium-telluride compounds.

4. The hybrid FPA of claim 3, wherein the electronic means comprises a multiplexer formed within a semiconducting substrate.

5. The hybrid FPA of claim 1, wherein the interconnection means is formed of a pliable conducting material.

6. The hybrid FPA of claim 1, wherein the interconnection means comprises a plurality of indium bumps.

7. The hybrid FPA of claim 1, wherein the cold plate comprises a ceramic material.

8. The hybrid FPA of claim 1, further comprising an isolating adhesive for securely mounting the CS to the cold plate, and for isolating the CS and detector from the cold plate.

9. The hybrid FPA of claim 8, wherein the materials forming the electronic means and the balancing substrate are selected according to their thicknesses and TECs, such that distortion associated with the isolating adhesive is minimized.

10. The hybrid FPA of claim 9, wherein the isolating adhesive is soft, localized, and sufficiently thick such that the electronic means is cooled by the cold plate without experiencing distortion and causing damage to the interconnection means.

11. A method of stabilizing a focal plane array (FPA) operable with an optical substrate for receiving impinging radiation and an electronic network coupled to the optical substrate for processing the radiation, the method comprising the steps of:

(a) connecting the electronic network to the optical substrate via an interconnection network of pliable, electrically-conducting material;

(b) attaching the electronic network to a core layer;

(c) coupling the core layer to a balancing substrate, wherein the electronic network, core layer and balancing substrate have associated thicknesses and thermal expansion coefficients (TECs), further wherein the thickness of the electronic network is selected to be different from the thickness of the balancing substrate such that when the optical substrate, the electronic network, the core layer, and the balancing substrate are exposed to thermal excursions in response to the received radiation, distortion and deflection of the electronic network and interconnection network typically associated with the thermal excursions are minimized;

(d) mounting the balancing substrate onto a support substrate via an isolation adhesive; and (e) curing the isolation adhesive such that the balancing substrate is securely separated from the support substrate.

12. The method of claim 11, wherein the electronic network and balancing substrate have associated thicknesses and thermal expansion coefficients (TECs), the method further comprising the steps of:

subjecting the optical substrate, the electronic network, and the balancing substrate to thermal excursions;

selecting the thickness of the electronic network to be different from the thickness of the balancing substrate such that distortion and deflection of the electronic network and interconnection network typically associated with the thermal excursions are minimized.

13. A composite focal plane array (FPA) structure defining a plurality of layered materials, the composite (FPA) structure for preventing undesirable deflection in the layered materials, comprising:

(a) an optical substrate for receiving optical radiation;

(b) an electronic signal processing network substrate having an associated modulus of elasticity, a thermal expansion coefficient (TEC), and thickness, the electronic signal processing network substrate having a substantially planar upper surface coupled to the optical substrate, wherein the electronic signal processing network substrate is responsive to the optical radiation received by the optical substrate;

(c) a core layer coupled to the electronic signal processing network substrate, and having an associated modulus of elasticity, TEC and thickness;

(d) a balancing substrate sandwiching the core layer adjacent the electronic signal processing network substrate, the balancing substrate having an associated modulus of elasticity, TEC, and thickness;

(e) a first epoxy layer disposed between the electronic signal processing network substrate and the core layer; and (f) a second epoxy layer disposed between the core layer and the balancing substrate, wherein the thickness of the electronic signal processing network substrate differs from the thickness of the balancing substrate such that the combination of the associated moduli of elasticity, thicknesses, and TECs of the electronic signal processing network substrate, the core layer, and the balancing substrate provides a balanced structure such that the substantially planar upper surface of the electronic signal processing network substrate is maintained in response to the received radiation.

14. The composite FPA structure of claim 13, further comprising adhesive means for attaching the optical substrate to the electronic signal processing network substrate, wherein the resultant combination of the moduli of elasticity, the TECs, and the thicknesses of the electronic signal processing network substrate, core layer, and balancing substrate minimizes deflection and distortion of the adhesive means in response to the received radiation.

15. The composite FPA structure of claim 13, wherein the moduli of elasticity, TECs, and the thicknesses of the materials forming the electronic signal processing network and balancing substrates, the core layer, and the first and second epoxy layers are determined such that a desired deflection in the upper surface of the electronic signal processing network substrate is produced.

16. The composite FPA structure of claim 15, wherein the desired deflection is produced in response to temperature changes in accordance with the received radiation.

* * * * *